US012327595B2

(12) United States Patent
Raimondo et al.

(10) Patent No.: US 12,327,595 B2
(45) Date of Patent: Jun. 10, 2025

(54) SHORTENED SINGLE-LEVEL CELL MEMORY PROGRAMMING

(71) Applicant: Micron Technology, Inc., Boise, ID (US)

(72) Inventors: Leo Raimondo, Avezzano (IT); Federica Paolini, Francavilla al Mare (IT); Umberto Siciliani, Rubano (IT); Violante Moschiano, Avezzano (IT); Gianfranco Valeri, Pescina (IT); Davide Esposito, Silvi (IT); Walter Di Francesco, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 228 days.

(21) Appl. No.: 17/976,423

(22) Filed: Oct. 28, 2022

(65) Prior Publication Data

US 2023/0134281 A1 May 4, 2023

Related U.S. Application Data

(60) Provisional application No. 63/275,865, filed on Nov. 4, 2021.

(51) Int. Cl.
*G11C 16/34* (2006.01)
*G11C 16/10* (2006.01)

(52) U.S. Cl.
CPC ........ *G11C 16/3459* (2013.01); *G11C 16/102* (2013.01)

(58) Field of Classification Search
CPC .............. G11C 16/3459; G11C 16/102; G11C 16/0483; G11C 16/10; G11C 16/30; G11C 16/08; G11C 16/24
See application file for complete search history.

(56) References Cited

U.S. PATENT DOCUMENTS

| | | | | |
|---|---|---|---|---|
| 5,537,357 A | * | 7/1996 | Merchant | G11C 16/3454 365/185.29 |
| 8,493,781 B1 | * | 7/2013 | Meir | G11C 16/3418 365/185.24 |
| 2018/0203613 A1 | * | 7/2018 | Tanzawa | H10B 41/35 |
| 2019/0214100 A1 | * | 7/2019 | Puthenthermadam | G11C 16/3427 |
| 2020/0005871 A1 | * | 1/2020 | Yang | G11C 16/0483 |

* cited by examiner

*Primary Examiner* — Khamdan N. Alrobaie
(74) *Attorney, Agent, or Firm* — Lowenstein Sandler LLP

(57) ABSTRACT

A memory device includes an array of memory cells configured as single-level cell memory and control logic operatively coupled to the array of memory cells. The control logic performs operations including: causing hardware initialization of a set of sub-blocks that are to be programmed within the array of memory cells; causing a first sub-block of the set of sub-blocks to be preconditioned for a program operation; causing multiple pages of data to be programmed to respective ones of the set of sub-blocks; and selectively causing a program verify to be performed on memory cells of the set of sub-blocks after programming the multiple pages of data.

17 Claims, 13 Drawing Sheets

SHORTENED SINGLE-LEVEL CELL MEMORY PROGRAMMING

REFERENCE TO RELATED APPLICATION

This application claims the benefit of U.S. Provisional Patent Application No. 63/275,865, filed Nov. 4, 2021, the entirety of which is incorporated herein by reference.

TECHNICAL FIELD

Embodiments of the disclosure relate generally to memory sub-systems, and more specifically, relate to shortened single-level cell memory programming.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1A:
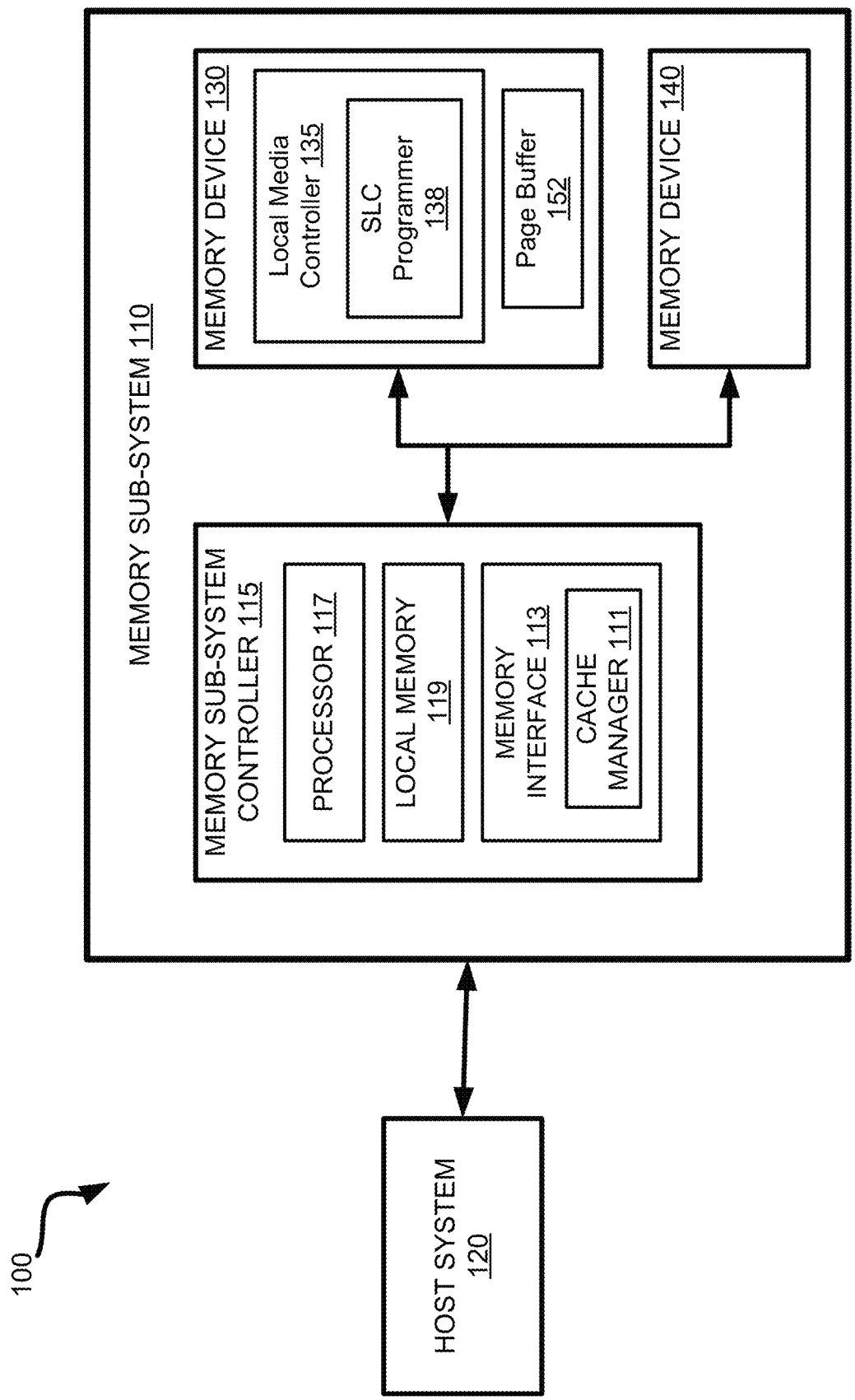
FIG. 1A illustrates an example computing system that includes a memory sub-system in accordance with some embodiments.

Aspects of the present disclosure are directed to shortened programming of memory devices configured as single-level cell (SLC) memory. In certain memory devices, including non-volatile memory devices such as negative-and (NAND) memory devices, system performance requirements are becoming more aggressive, such as demands for shorter times for programming to (tProg) and reading from (tR) NAND cells of the memory devices. Thus, these memory devices tend to include a portion of the NAND array which can be utilized as SLC cache in which to program SLC data (and from which to read the SLC data) before transferring the SLC data in the SLC cache to multiple-level cell (MLC) memory, such as triple-level cell (TLC) memory, quad-level cell (QLC) memory, or penta-level cell (PLC) memory, which are discussed in more detail with reference to FIG. 1A. The program and read times of SLC memory are faster than those of TLC and much faster than those of high-ordered MLC memory such as QLC and PLC memories.

In these memory devices, however, every program cycle utilizes control logic on the memory device to perform the same series of operations to program each SLC page to a corresponding sub-block of the SLC memory, causing unwanted performance delays as each page is programmed sequentially in turn. This series of operations, for example, for each sub-block, includes starting a program operation with some hardware initialization, performing a seed operation in which cells of the sub-block are preconditioned to a particular voltage, causing a pulse to program the sub-block, performing a wordline/bitline recovery of the sub-block, performing a program verify (PVFY) operation to check whether the sub-block has been programmed to a particular threshold PVFY voltage, perform a final verification operation to determine whether the programming has completed, and ending the program operation. All of these operations are repeated for each page programmed into each sub-block of memory cells configured as SLC memory, thus incurring significant performance delays.

Aspects of the present disclosure address the above and other deficiencies of programming to SLC memory by causing, by a local media controller (e.g., control logic) of the memory device, to shorten the above-discussed series of operations such that multiple pages of data are programmed to a set of sub-blocks before performing the program verify operation (and operations subsequent to the program verify operation). In these embodiments, there is a one-to-one correspondence between pages of data and sub-blocks in which the pages of data are stored due to the memory cells being configured as SLC memory.

In at least some embodiments, after programming data to a first sub-block, the control logic can direct a reduced seed operation at each subsequent sub-block of the set of sub-blocks, prior to programming each of these sub-blocks. A reduced seed operation can be understood to be a preconditioning of cells of the next sub-block to be programmed, but without any need to remove a possible negative potential from the wordline, e.g., due to not performing a program verify in between subsequent programming operations. In some embodiments, this preconditioning includes allowing the wordline to discharge to a particular voltage level. Thus, in these embodiments, the program verify operation is performed concurrently on all of the sub-blocks of the set of sub-blocks after fully programming the set of sub-blocks. In at least some embodiments, this program verify includes performing a single program verify on all of the set of sub-blocks together after each of the set of sub-blocks is in a programmed state. If one of the set of sub-blocks remains in an erased state, however, no program verify operation is performed on any of the sub-blocks. If no program verify operation is performed, no additional program pulse is necessary, thus saving further on performance.

Advantages of this approach include, but are not limited to, improved performance in the memory sub-system. In the manner described herein, the performance improvement can be at least a third faster programming time to the SLC memory, with some programming times being reduced by at least forty percent. When programming times improve, read operations can be completed more quickly. For example, some read operations have to wait for data to be read to be fully programmed to the memory array before the read operation can be completed. These and other advantages apparent to those skilled in the art of memory programming will be discussed in detail below.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices. The memory sub-system 110 can be a storage device, a memory module, or a hybrid of a storage device and memory module.

The memory device 130 can be a non-volatile memory device. One example of non-volatile memory devices is a negative-and (NAND) memory device. A non-volatile memory device is a package of one or more dice. Each die can include one or more planes. Planes can be groups into logic units (LUN). For some types of non-volatile memory devices (e.g., NAND devices), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1," or combinations of such values.

The memory device 130 can be made up of bits arranged in a two-dimensional or three-dimensional grid, also referred to as a memory array. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface, Open NAND Flash Interface (ONFI) interface, or some other interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113, which includes a cache manager 111. The memory interface component 113 is responsible for handling interactions of the memory sub-system controller 115 with the memory devices of memory sub-system 110, such as memory device 130. For example, the memory interface component 113 can send memory access commands corresponding to requests received from the host system 120 to the memory device 130, such as program commands, read commands, or other commands. In addition, the memory interface component 113 can receive data from the memory device 130, such as data retrieved in response to a read command or a confirmation that a program command was successfully performed. In some embodiments, the memory sub-system controller 115 includes at least a portion of the cache manager 111. For example, the memory sub-system controller 115 can include a processor 117 (e.g., a processing device) configured to execute instructions stored in local memory 119 for performing the operations described herein. In some embodiments, the memory interface component 113 is part of the host system 120, an application, or an operating system. In one embodiment, memory interface 113 includes a cache manager 111, among other sub-components. The cache manager 111 can direct memory access commands, such as a read command, a cache read command, a snap read command, a cache read context switch command, or a cache reach context restore command, to memory device 130.

In one embodiment, the local media controller 135 includes a SLC programmer 138 and the memory device 130 includes a page buffer 152 of multiple page buffers that store data temporarily (e.g., buffered) while data is being either programmed to or read from memory cells of the memory device 130. In these embodiments, the SLC programmer 138 can direct program operations that program data stored in the page buffer 152 into a set of sub-blocks of an array of SLC memory of the memory device 130. For example, the SLC programmer 138 can cause hardware initialization of the set of sub-blocks that are to be programmed within the array. The SLC programmer 138 can further cause a first sub-block of the set of sub-blocks to be preconditioned for a program operation. In these embodiments, the SLC programmer 138 further causes multiple pages of data to be programmed to respective ones of the set of sub-blocks. The SLC programmer 138 can further cause a program verify to be performed on memory cells of the set of sub-blocks after programming the multiple pages of data. Additional details with regards to the operations of the cache manager 111 and parallel programmer 138 are described below.

Figure 1B:
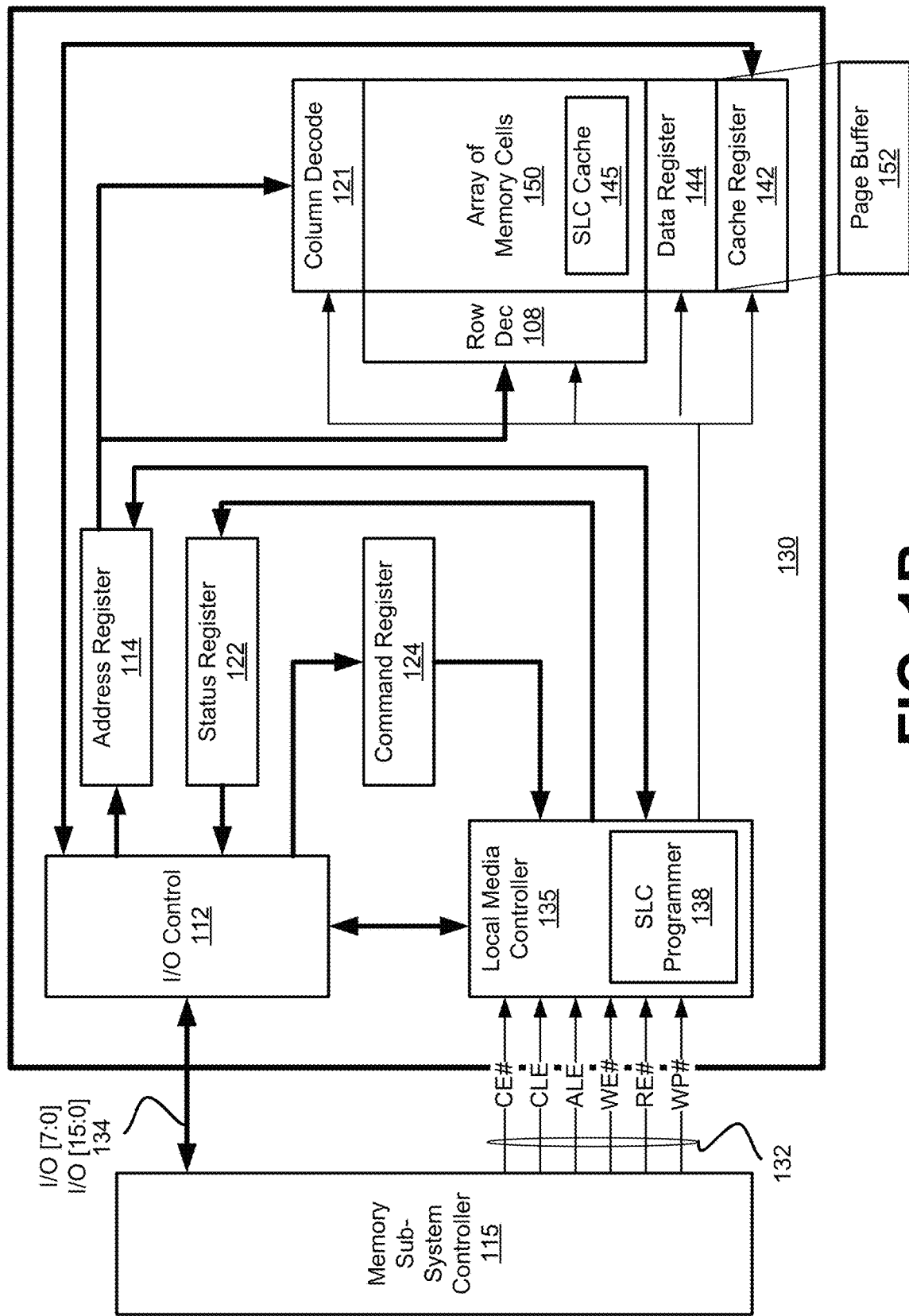
FIG. 1B is a block diagram of a memory device in communication with a memory sub-system controller of a memory sub-system according to at least one embodiment.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 150 logically arranged in rows and columns. Memory cells of a logical row are typically connected to the same access line (e.g., a word line) while memory cells of a logical column are typically selectively connected to the same data line (e.g., a bitline). A single access line may be associated with more than one logical row of memory cells and a single data line may be associated with more than one logical column. Memory cells (not shown in FIG. 1B) of at least a portion of array of memory cells 150 are capable of being programmed to one of at least two target data states.

In some embodiments, the array of memory cells 150 includes a portion that is SLC cache 145 made up of memory cells configured as SLC memory, e.g., and thus to include the set of sub-blocks to which is referred herein. In some embodiments, the SLC cache 145 is a relatively small percentage of the entire array of memory cells 150, such as between 5 to 15 percent in some embodiments. When the local media controller 135 can direct programming first into the SLC cache 145, the initial programming can be performed more quickly due to the faster performance of programming to SLC memory. The local media controller 135 can then schedule to compress the SLC data with subsequent programming into the rest of the array of memory cells 150 that can include some other MLC memory type.

Row decode circuitry 108 and column decode circuitry 121 are provided to decode address signals. Address signals are received and decoded to access the array of memory cells 150. Memory device 130 also includes input/output (I/O) control circuitry 112 to manage input of commands, addresses and data to the memory device 130 as well as output of data and status information from the memory device 130. An address register 114 is in communication with I/O control circuitry 112 and row decode circuitry 108 and column decode circuitry 121 to latch the address signals prior to decoding. A command register 124 is in communication with I/O control circuitry 112 and local media controller 135 to latch incoming commands.

A controller (e.g., the local media controller 135 internal to the memory device 130) controls access to the array of memory cells 150 in response to the commands and generates status information for the external memory sub-system controller 115, i.e., the local media controller 135 is configured to perform access operations (e.g., read operations, program operations and/or erase operations) on the array of memory cells 150. The local media controller 135 is in communication with row decode circuitry 108 and column decode circuitry 121 to control the row decode circuitry 108 and column decode circuitry 121 in response to the addresses. In one embodiment, local media controller 135 includes the SLC programmer 138, which can implement the shortened SLC programming of SLC memory of the memory device 130, as described herein.

The local media controller 135 is also in communication with a cache register 142. Cache register 142 latches data, either incoming or outgoing, as directed by the local media controller 135 to temporarily store data while the array of memory cells 150 is busy writing or reading, respectively, other data. During a program operation (e.g., write operation), data may be passed from the cache register 142 to the data register 144 for transfer to the array of memory cells 150; then new data may be latched in the cache register 142 from the I/O control circuitry 112. During a read operation, data may be passed from the cache register 142 to the I/O control circuitry 112 for output to the memory sub-system controller 115; then new data may be passed from the data register 144 to the cache register 142. The cache register 142 and/or the data register 144 may form (e.g., may form a portion of) a page buffer 152 of the memory device 130. The page buffer 152 may further include sensing devices (not shown in FIG. 1B) to sense a data state of a memory cell of the array of memory cells 150, e.g., by sensing a state of a data line connected to that memory cell. A status register 122 may be in communication with I/O control circuitry 112 and the local media controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 142. The data may be subsequently written into data register 144 for programming the array of memory cells 150.

In an embodiment, cache register 142 may be omitted, and the data may be written directly into data register 144. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2:
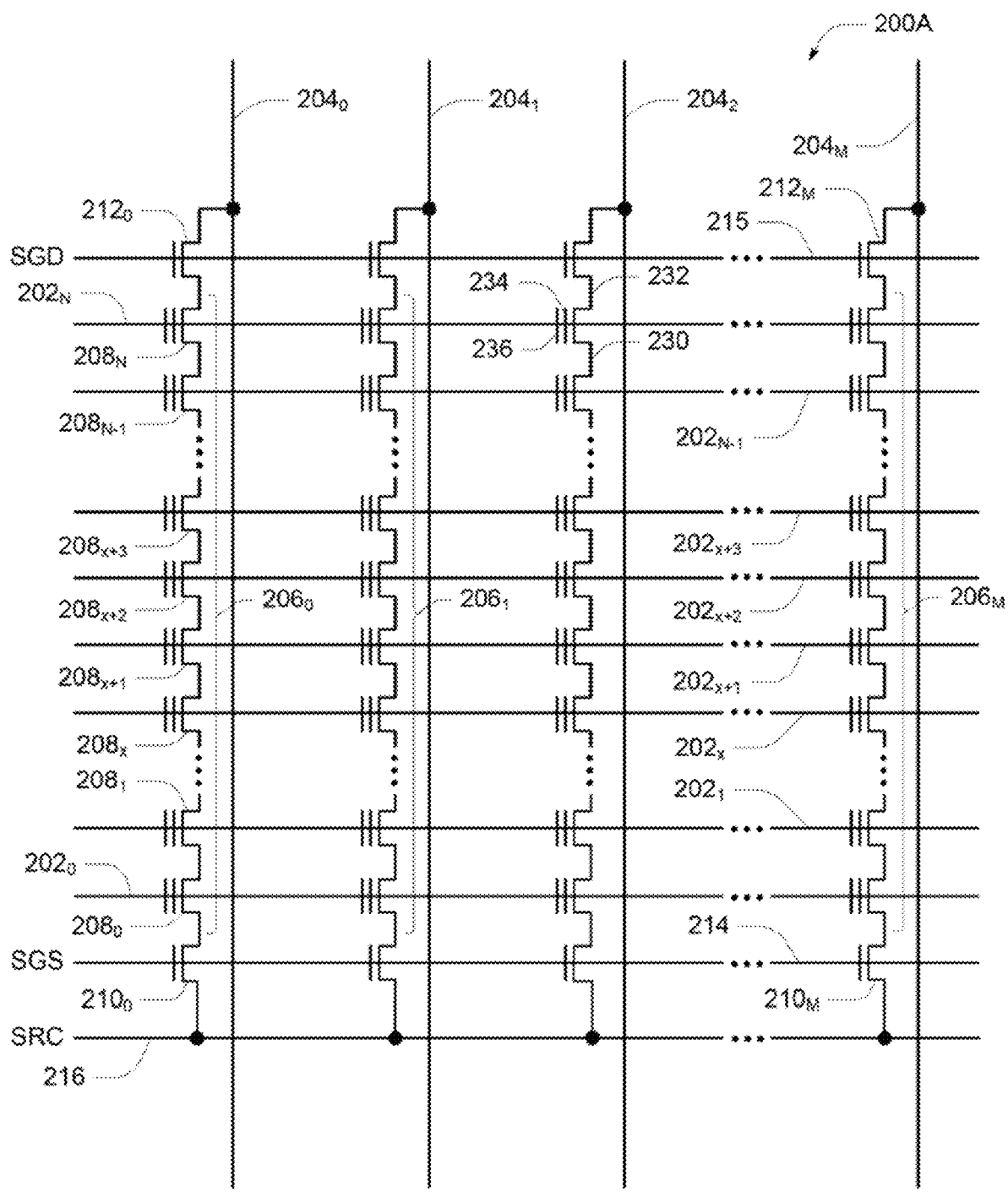
FIG. 2 is a schematic of portions of an array of memory cells as could be used in a memory of the type described with reference to FIG. 1B according to an embodiment.

FIG. 2 is a schematic of portions of an array 200A of memory cells as could be used in a memory of the type described with reference to FIG. 1B according to an embodiment, to include, for example, the SLC cache 145. Memory array 200A includes access lines, such as word lines $202_0$ to $202_N$, and data lines, such as bit lines $204_0$ to $204_M$. The word lines 202 can be connected to global access lines (e.g., global word lines), not shown in FIG. 2, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well.

The memory array 200A can be arranged in rows (each corresponding to a word line 202) and columns (each corresponding to a bit line 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216, or SRC. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

The memory array 200A in FIG. 2 can be a quasi-two-dimensional memory array and can have a generally planar structure, e.g., where the common source 216, NAND strings 206 and bit lines 204 extend in substantially parallel planes. Alternatively, the memory array 200A in FIG. 2 can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, or the like) that can determine a data state of the memory cell (e.g., through changes in threshold voltage), and a control gate 236, as shown in FIG. 2. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a word line 202.

A column of the memory cells 208 can be a NAND string 206 or a number of NAND strings 206 selectively connected to a given bit line 204. A row of the memory cells 208 can be memory cells 208 commonly connected to a given word line 202. A row of memory cells 208 can, but need not, include all the memory cells 208 commonly connected to a given word line 202. Rows of the memory cells 208 can often be divided into one or more groups of physical pages of memory cells 208, and physical pages of the memory cells 208 often include every other memory cell 208 commonly connected to a given word line 202. For example, the memory cells 208 commonly connected to word line $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to word line $202_N$ and selectively connected to odd bit lines 204 (e.g., bit lines $204_1$, $204_3$, $204_5$, etc.) can be another physical page of the memory cells 208 (e.g., odd memory cells).

Although bit lines $204_3$-$204_5$ are not explicitly depicted in FIG. 2, it is apparent from the figure that the bit lines 204 of the array of memory cells 200A can be numbered consecutively from bit line $204_0$ to bit line $204_M$. Other groupings of the memory cells 208 commonly connected to a given word line 202 can also define a physical page of memory cells 208. For certain memory devices, all memory cells commonly connected to a given word line can be deemed a physical page of memory cells. The portion of a physical page of memory cells (which, in some embodiments, could still be the entire row) that is read during a single read operation or programmed during a single program operation (e.g., an upper or lower page of memory cells) can be deemed a logical page of memory cells. A block of memory cells can include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells. Although the example of FIG. 2 is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 3:
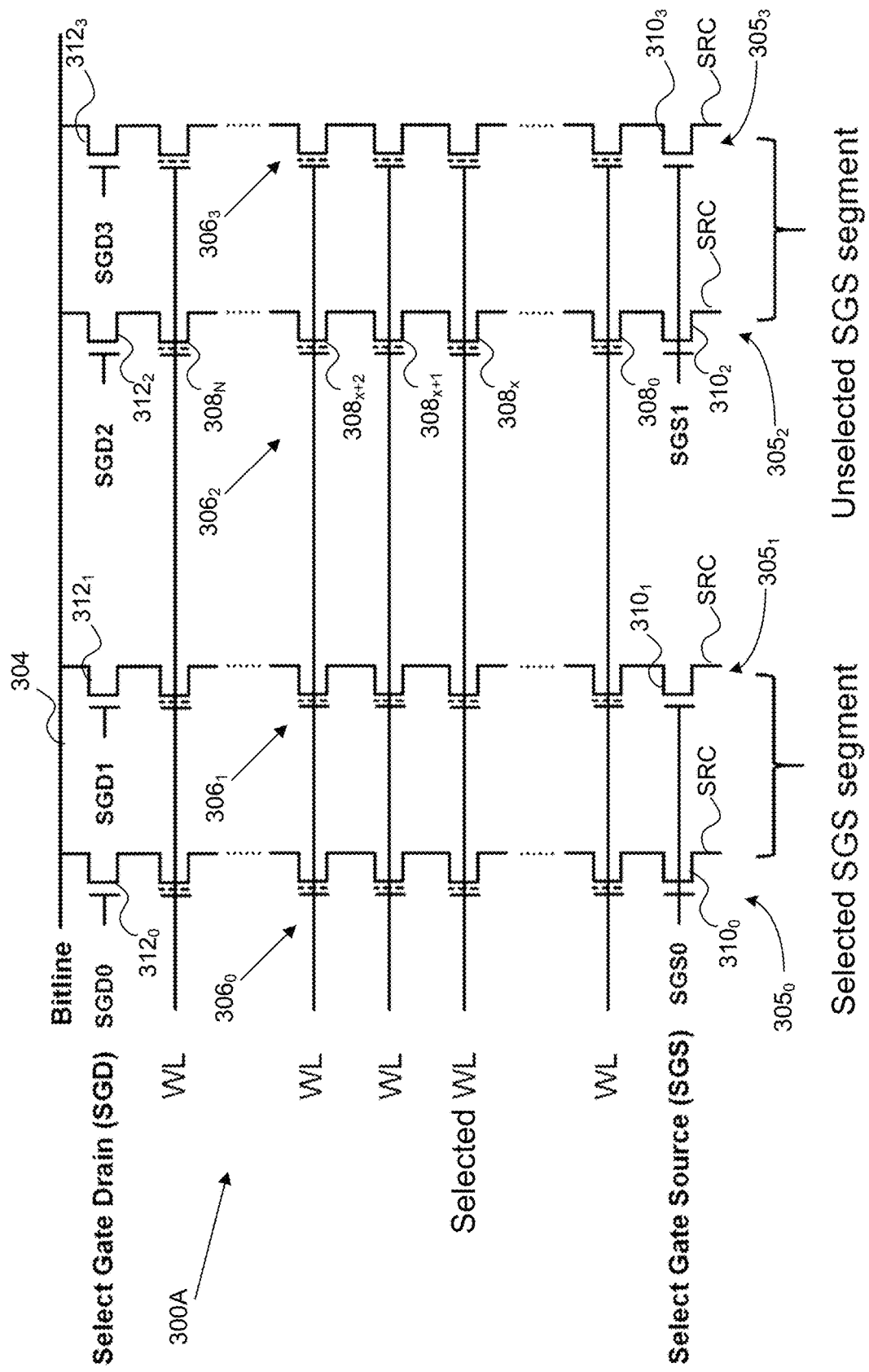
FIG. 3 is a schematic of two segments of an array of memory cells that include four sub-blocks according to at least some embodiments.

FIG. 3 is a schematic of two segments of an array of memory cells 300A that include four sub-blocks according to at least some embodiments. In some embodiments, the array of memory cells 300A is included in the SLC cache 145 of the memory device 130. For example, in segmented SGS (or SSGS) architecture, strings of memory cells can be grouped into sub-blocks, where there are two sub-blocks per SGS segment in some embodiments. A first (e.g., selected) SGS segment can include a first sub-block $305_0$ and a second sub-block $305_1$. A second (e.g., unselected) SGS segment can include a third sub-block $305_2$ and a fourth sub-block $305_3$. Other numbers of sub-blocks can be included in segments in other embodiments.

Specifically, in at least some embodiments, the array of memory cells 300A of FIG. 3 includes a bit line 304, where each sub-block is coupled to the bit line 304. The first sub-block $305_0$ (assumed to be the selected sub-block for ease of explanation) can include a first drain select (SGD) transistor $312_0$, a first source select (SGS) transistor $310_0$, and a first string of memory cells $306_0$ coupled therebetween. The second sub-block $305_1$ can include a second SGD transistor $312_1$, a second SGS transistor $310_1$, and a second string of memory cells $306_1$ coupled therebetween. The third sub-block $305_2$ can include a third SGD transistor $312_2$, a third SGS transistor $310_2$, and a third string of memory cells $306_2$ coupled therebetween. The fourth sub-block $305_3$ can include a fourth SGD transistor $312_3$, a fourth SGS transistor $310_3$, and a fourth string of memory cells $306_3$ coupled therebetween. By way of example, the third string of memory cells $306_2$, included in the unselected SGS segment, includes multiple memory cells $308_0$ . . . $308_N$. Each SGS transistor can be connected to a common source (SRC), e.g., a source voltage line, to provide voltage to the sources of the multiple memory cells $308_0$ . . . $308_N$.

In some embodiments, the source voltage line includes a source plate that supplies the source voltage. In at least some embodiments, multiple wordlines (WLs) are coupled with gates of memory cells of each string of memory cells $306_0$ . . . $306_3$. Each string of memory cells can include a channel (not illustrated), which is coupled between the SGS transistor and SGD transistor of a sub-block.

In these embodiments, a first drain select gate line (SGD0) is connected to the gate of the first SGD transistor $312_0$, a second drain select gate line (SGD1) is connected to the gate of the second SGD transistor $312_1$, a third drain select gate line (SGD2) is connected to the gate of the third SGD transistor $312_2$, and a fourth drain select gate line (SGD3) is connected to the gate of the fourth SGD transistor $312_3$. Further, a first source select gate line (SGS0) can be connected to gates of the first and second SGS transistors $310_0$ and $310_1$. Additionally, a second source select gate line (SGS1) can be connected to gates of the third and fourth SGS transistors $310_2$ and $310_3$. Thus, the source voltage of each string of memory cells can be jointly controlled by the source select gate line (SGS0 or SGS1) for a separate segment, where the first segment is a combination of the first and second sub-blocks $305_0$ and $305_1$ and the second segment is a combination of the third and fourth sub-blocks $305_2$ and $305_3$.

Figure 4:
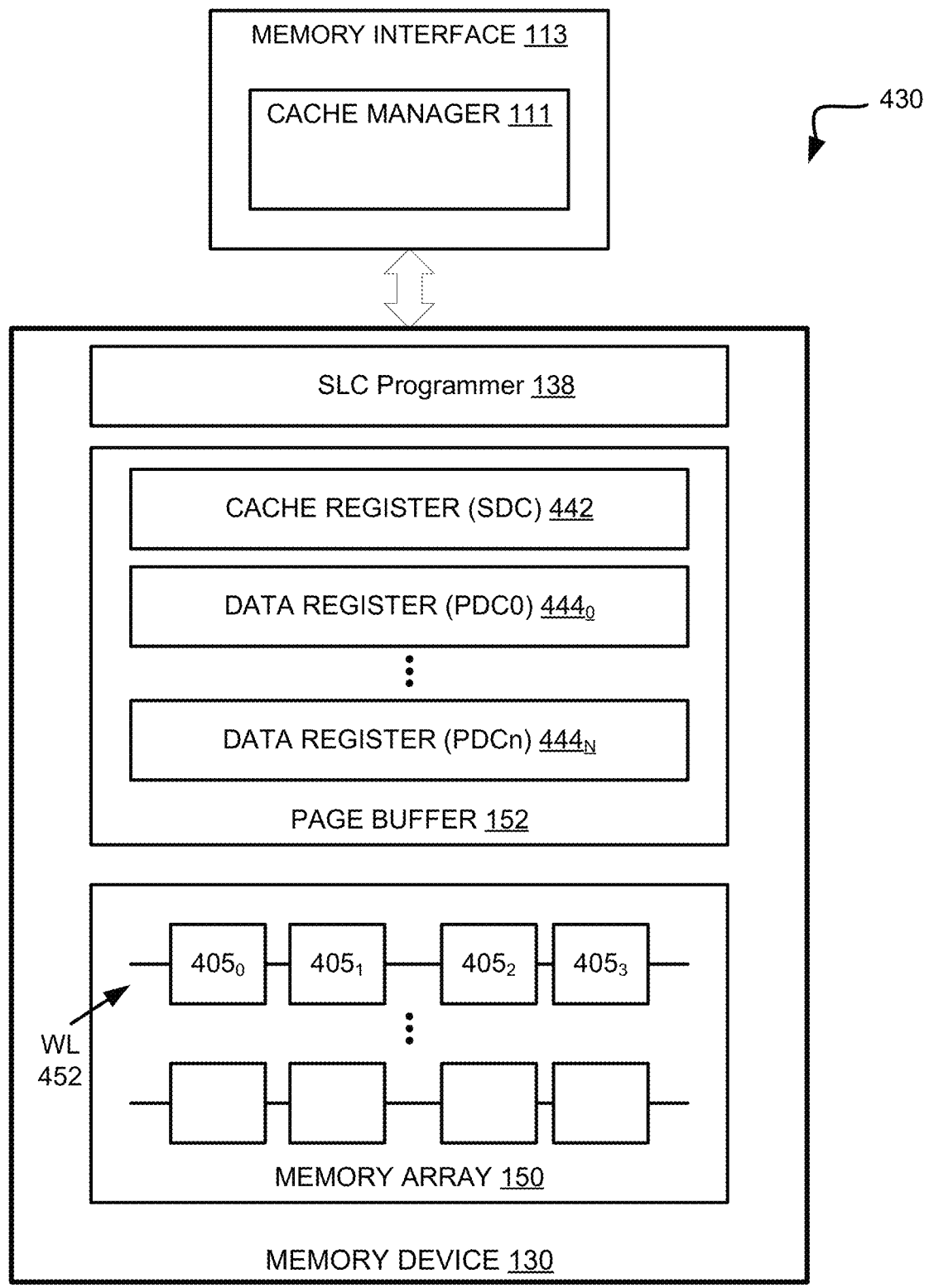
FIG. 4 is a block diagram illustrating a memory sub-system having a page buffer that includes registers from which to program a set of sub-blocks of a memory array that are configured as single-level cell (SLC) memory according to some embodiments.

FIG. 4 is a block diagram illustrating a memory subsystem 430 having a page buffer that includes registers from which to program a set of sub-blocks of a memory array that are configured as single-level cell (SLC) memory in accordance with some embodiments of the present disclosure. In one embodiment, the memory interface 113 is operatively coupled with the memory device 130. In one embodiment, the memory device 130 includes the page buffer 152 and the memory array 150. The memory array 150 can include an array of memory cells formed at the intersections of wordlines, such as wordline 452, and bitlines, e.g., $204_M$ or 304 illustrated in FIG. 2 and FIG. 3, respectively. As discussed, these memory cells can be configured as SLC memory and thus be included within the SLC cache 145.

In one embodiment, the memory cells are grouped into blocks, which can be further divided into sub-blocks, where a given wordline, such as wordline 452, is shared across a number of sub-blocks $405_0$, $405_1$, $405_2$, $405_3$, for example. In one embodiment, each sub-block corresponds to a separate plane in the memory array 150. The group of memory cells associated with a wordline within a sub-block is referred to as a physical page. Each physical page in one of the sub-blocks can be one of multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). In some embodiments, a physical page formed from memory cells of the QLC memory type can have a total of four logical pages, where each logical page can store data distinct from the data stored in the other logical pages associated with that physical page.

Depending on the programming scheme used, each logical page of a memory cell can be programmed in a separate programming pass, or multiple logical pages can be programmed together. For example, in a QLC physical page, the LP can be programmed on one pass, and the UP, XP and TP can be programmed on a second pass. Other programming schemes are possible. The page buffer 152 is a buffer used to temporarily store data being read from or written to the memory array 150 of the memory device 130, and can include a cache register 442 and one or more data registers $444_0$-$444_N$. For a read operation, the data is read from the memory array 150 into one of data registers $444_0$-$444_N$, and then into the cache register 442. The memory interface 113 can then read out the data from the cache register 442. For a program operation, the memory interface 113 writes the data to the cache register 442, which is then passed to one of the data registers $444_0$-$444_N$, and finally programmed to the memory array 250. In at least some embodiments, the cache register 442 and the one or more data registers $444_0$-$444_N$ are configured as SLC memory, and thus, the disclosed embodiments can likewise apply to programming these registers in the page buffer 152. If the program operation includes multiple pages (e.g., UP, XP, and TP), each page can have a dedicated data register to hold the corresponding page data. Functionality of the parallel programmer 138 introduced in FIG. 1, will be discussed in more detail with reference to FIGS. 6A-8B.

Figure 5A:
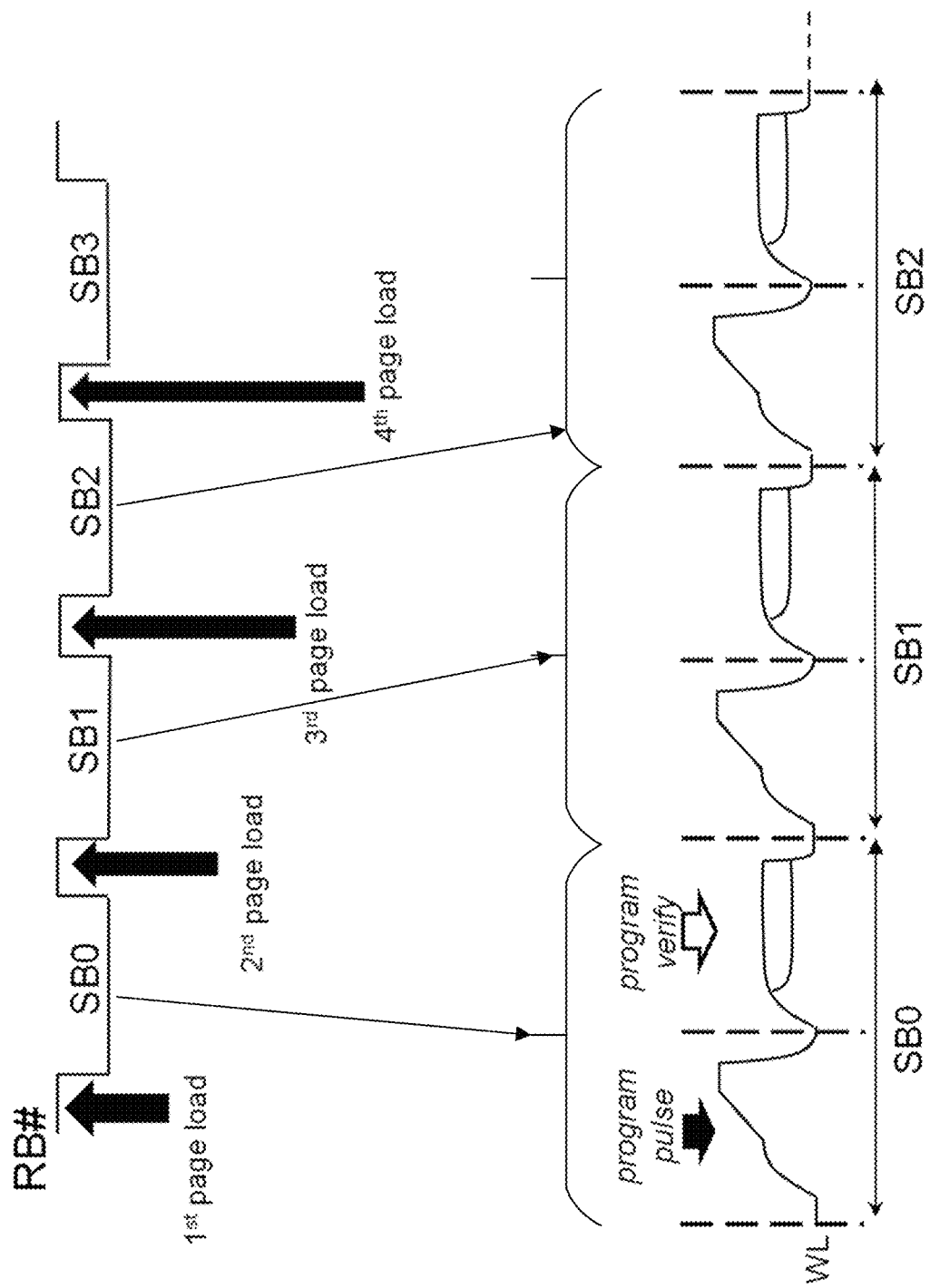
FIG. 5A is a pair of graphs illustrating programming multiple pages of data to a set of sub-blocks in certain memory devices configured as SLC memory.

FIG. 5A is a pair of graphs illustrating programming multiple pages of data to a set of sub-blocks in certain memory devices configured as SLC memory. The set of sub-blocks, for example, can be understood to be a set of sub-blocks such as those illustrated and discussed with reference to FIGS. 1B-4. At top, the ready busy (RB #) signal is illustrated. When the ready busy signal is pulsed high, a LUN (such as a die) that includes the sub-blocks is busy and data is being loaded from the controller 115 into the page buffer 152, e.g., the cache register 442. When the ready busy signal is pulsed low, the LUN transitions to a ready state and can proceed with performing a program operation to program the buffered data to the array of memory cells 150. As previously discussed, the program operation can include programming the data to a sub-block of the SLC cache 145 in some embodiments.

As can be observed, in certain memory devices, the programming performed by a memory device (e.g., by control logic of a local media controller) causes regular transitions between loading page data and programming that page data to a sub-block, e.g., load a first page, program the first page to a first sub-block (SB0), load a second page, program the second page to a second sub-block (SB1), and so forth, for a set of sub-blocks such as SB0, SB1, SB2, SB3. During each program operation to a different sub-block, as illustrated in the bottom graph, a program pulse is generated to program the sub-block followed by a separate program verify operation to verify the threshold voltages of the programmed cells of that sub-block. As discussed, duplicative performing of these programming and program verify operations sequentially like this incurs performance delays.

Figure 5B:
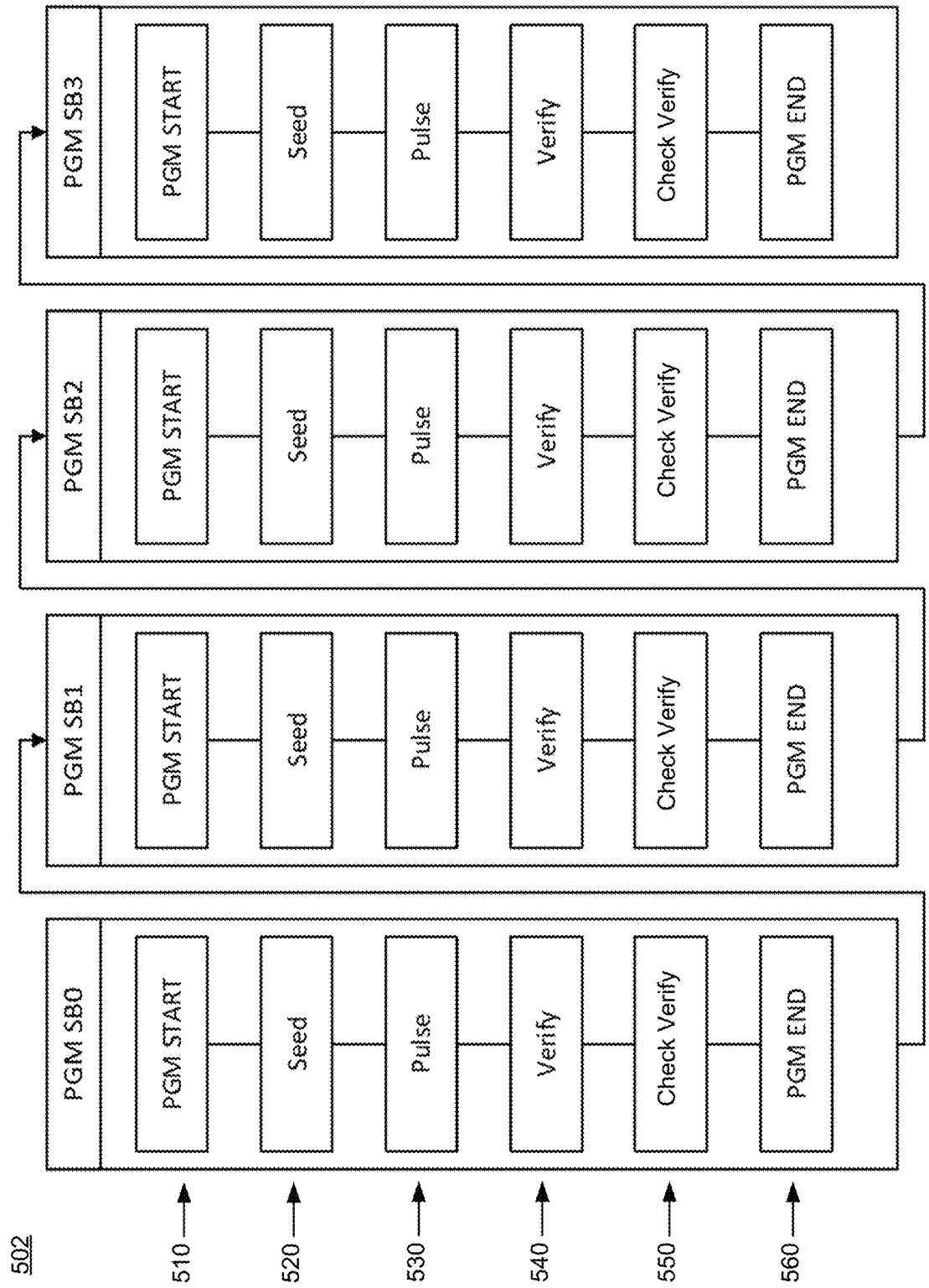
FIG. 5B is a flow diagram of sequential operations generally performed in the certain memory devices to program the multiple pages of data to the set of sub-blocks.

FIG. 5B is a flow diagram of sequential operations 502 generally performed in the certain memory devices to program the multiple pages of data to the set of sub-blocks. As an extension to the explanation of FIG. 5A, the flow diagram of FIG. 5B illustrates a series of operations that make up each program operation for programming and verifying data programmed to SLC memory. For example, for programming a page of data to each sub-block, this series of operations include, but are not limited to, at operation 510, performing a program start (or other initialization); at operation 520, seeding or preconditioning voltage levels of memory cells of the sub-block for programming; at operation 530, sending a program pulse to perform the actual programming of the page of data; at operation 540, performing a program verify to verify threshold voltages of the memory cells of the sub-block; at operation 550, performing a check verification operation to determine results of the program verify and that the data is completely programmed; and, at operation 560, ending the program operation.

More specifically, the seed operation 520 includes ramping a wordline of the sub-block in preparation for programming. Further, the program verify performed at operation 540 includes potentially accumulating a negative potential on a wordline, which has to be reset before being able to perform another program on another sub-block of the wordline, as illustrated in the "program verify" portion of FIG. 5A. This ramping and resetting of the wordline incurs additional performance delays.

These are high-level operations, as many additional operations or sub-operations are performed with relation to programming and verification. For example, some of these additional operations include recovery of the wordlines and bitlines in order to perform program verify in some cases and then as part of recovery after program verify or at the end of programming, e.g., at operation 560, in other cases. As discussed, duplicative performing of these programming and program verify operations sequentially (to program, e.g., all four sub-blocks SB0, SB1, SB2, and SB3) like this incurs performance delays.

Figure 6A:
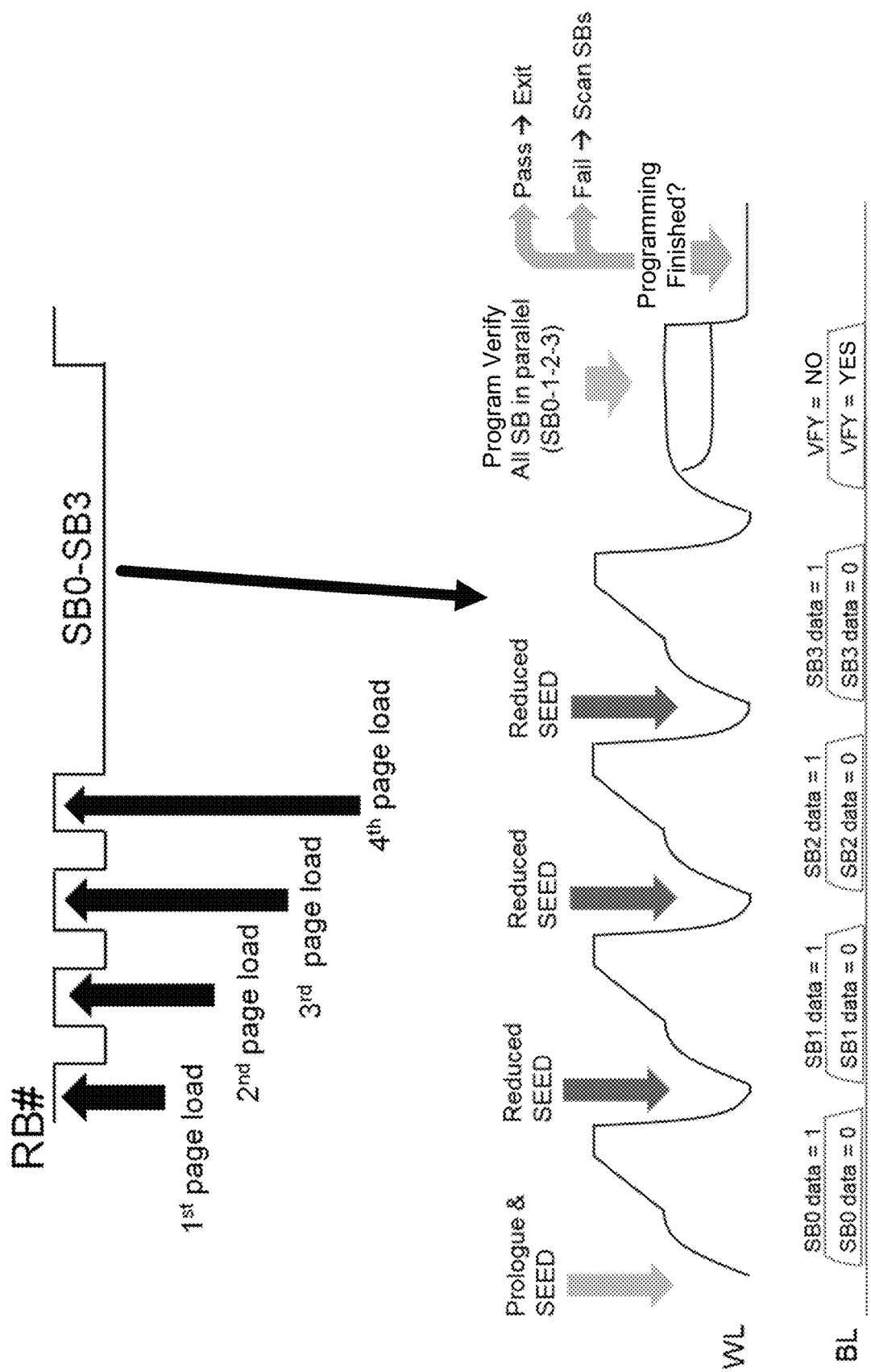
FIG. 6A is a pair of graphs illustrating programming multiple pages of data to a set of sub-blocks in present memory devices configured as SLC memory according to some embodiments.

FIG. 6A is a pair of graphs illustrating programming multiple pages of data to a set of sub-blocks in present memory devices configured as SLC memory according to some embodiments. These graphs can be contrasted with the graphs of FIG. 5A and describe operations that can be performed or directed by the SLC programmer 138 of the local media controller 135, otherwise referred to as control logic herein. As a first point of contrast, according to at least some embodiments, the loading of the pages of data, e.g., a first page, a second page, a third page, and a fourth page by way of example, is performed all up front before the actual programming occurs. This enables tying up the ready busy signal (RB #) for short intervening periods (to load the pages of data) followed by a long period during which the memory device 130 programs the loaded pages of data into respective sub-blocks (SB0, SB1, SB2, SB3) of the set of sub-blocks, which is illustrated in the bottom graph.

In at least some embodiments, the "prologue" operation performed before programming the first sub-block (SB0) of the set of sub-blocks can include initialization of a charge pump and other analog hardware that will be employed in programming the set of sub-blocks. Charge pumps will enable ramping bitlines, wordlines, and source voltage lines to target voltages useable for programming. As illustrated, however, full preconditioning of the subsequent sub-blocks that are programmed is avoided when not having to perform a program verify.

With additional reference to the bottom graph, further by of way efficiency-enhancing changes from the operations of FIG. 5A, the intervening "program verify" operations have been removed in favor of performing four sequential programs to the set of sub-blocks only with intervening reduced seed operations. A reduced seed operation can be understood to be a preconditioning of cells of the next sub-block to be programmed, but without any need to remove a possible negative potential from the wordline, e.g., due to not performing a program verify. Because no negative potential is accumulated on the wordline, neither is a reset of the wordline potential in between programming to respective sub-blocks, providing significant performance savings.

Figure 6B:
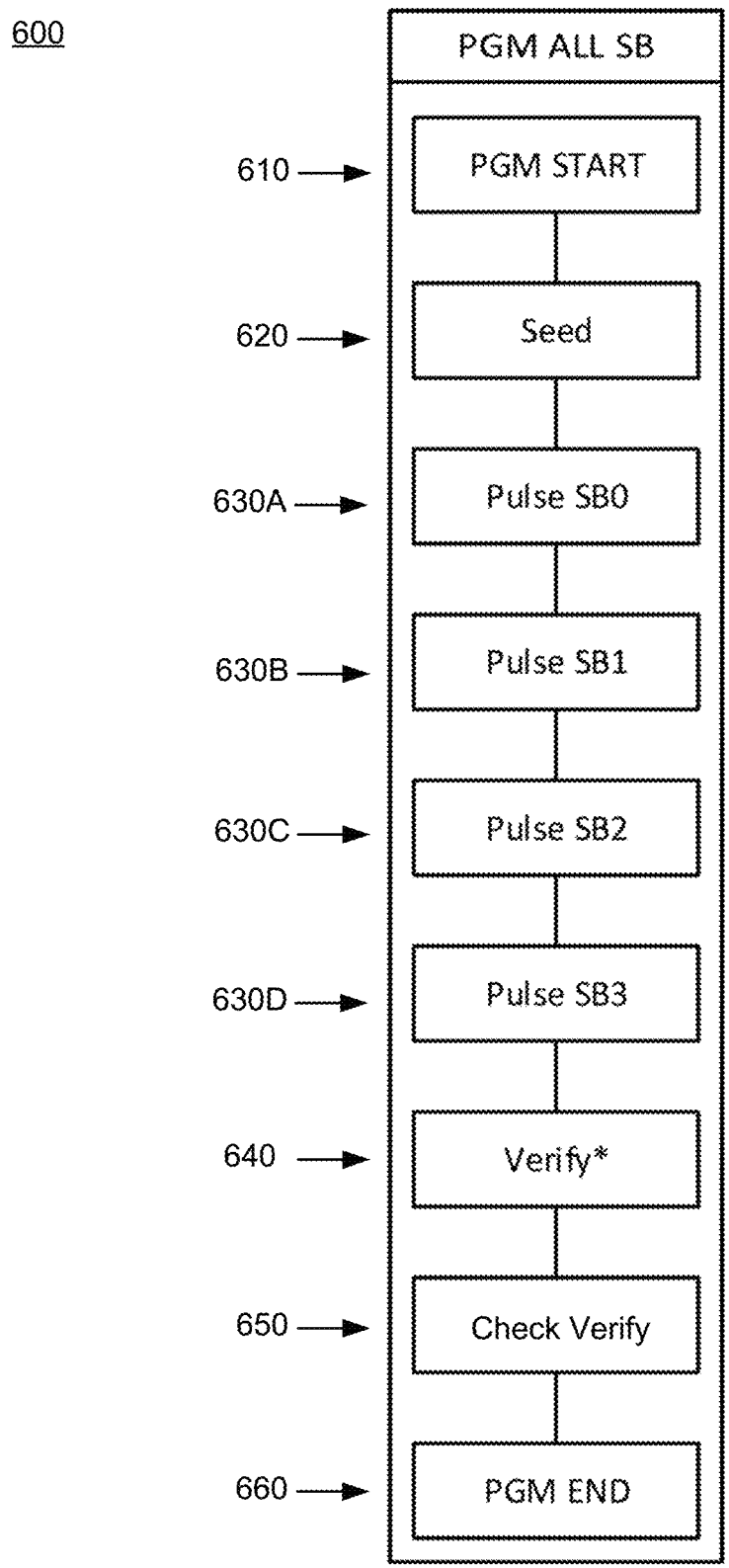
FIG. 6B is a flow diagram of sequential operations performed in present memory devices to program the multiple pages of data to the set of sub-blocks according to some embodiments.

With additional reference to FIG. 6B, a program verify is instead selectively performed on the set of sub-blocks after programming the multiple pages of data to the set of sub-blocks (e.g., SB0, SB1, SB2, SB3). More specifically, this program verify is also a special version of program verify in that a program verify is only actually performed on the memory cells of the set of sub-blocks when each of the set of sub-blocks is in a programmed state. For example, only when a programmed state (e.g., which can be a "0" value or a "1" value depending on implementation) is stored in each of the set of sub-blocks is the program verify performed on the set of sub-blocks in parallel. Thus, if any sub-block of the set of sub-blocks remains in an erased state, no program verify is performed on the set of sub-blocks. This skipping of the program verify by the control logic may be at least because performing a program verify on a memory cell in an erased state can cause the memory cell to be discharged through a connected bitline (or common source line), likely causing a false fail result of the program verify.

In other words, in these embodiments, no intervening program verify operation is performed between completing programming of one sub-block and initiating programming of the next sub-block. In another example, no additional program verify operation is performed after initiating programming of the sub-blocks and before the single program verify is performed.

In at least some embodiments, as a final operation, the control logic causes a check verification operation to be performed on the set of sub-blocks following the selective program verify to determine whether the program operation successfully finished. The check verification operation can determine the results of the program verify and that the multiple pages of data have been completely programmed. The control logic can further cause exiting a program operation of the set of sub-blocks in response to passing the check verification operation or causing a scan to be performed of the set of sub-blocks in response to failing the check verification operation.

FIG. 6B is a flow diagram of sequential operations 600 performed in present memory devices to program the multiple pages of data to the set of sub-blocks according to some embodiments. The sequential operations 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the sequential operations 600 is performed by the SLC programmer 138 of FIGS. 1A-1B.

As an extension to the explanation of FIG. 6A, the flow diagram of FIG. 6B illustrates that some of the operations discussed with reference to FIG. 5A can be executed only once for the set of sub-blocks combined with a streamlined programming of the multiple pages sequentially to the multiple-sub-blocks in between performing these other operations. More specifically, according to at least some embodiments, the operations that need not be performed multiple times include operations 610, 620, 640, 650, and 660, discussed below.

At operation 610, the processing logic performs initialization of the set of sub-blocks for programming. This initialization, for example, can be the "prologue" discussed with reference to FIG. 6A, e.g., in which the charge pump and other programming hardware for the set of sub-blocks are initialized.

At operation 620, the processing logic directs a seed operation to be performed on the set of sub-blocks to precondition the voltage levels (e.g., of the wordline and the bitline) of the memory cells of the set of sub-blocks in preparation for programming.

At operation 630A, the processing logic triggers a program pulse to program a first page of the multiple pages to a first sub-block (e.g., SB0) of the set of sub-blocks. Operation 630A can also include the processing logic causing a recovery operation to be performed at the first sub-block.

At operation 630B, the processing logic causes a reduced seed operation to be performed at a second sub-block (e.g., SB1) of the set of sub-blocks to precondition the second sub-block for programming. In these embodiments, the reduced seed operation takes a period of time that is shorter than that for preconditioning the first sub-block. The processing logic further causes a program pulse to be sent to the second sub-block to program a second page of the multiple pages of data to the third sub-block. The processing logic further causes a recovery operation to be performed at the second sub-block.

At operation 630C, the processing logic causes a reduced seed operation to be performed at a third sub-block (e.g., SB2) of the set of sub-blocks to precondition the third sub-block for programming. In these embodiments, the reduced seed operation takes a period of time that is shorter than that for preconditioning the first sub-block. The processing logic further causes a program pulse to be sent to the third sub-block to program a third page of the multiple pages of data to the third sub-block. The processing logic further causes a recovery operation to be performed at the third sub-block.

At operation 630D, the processing logic causes a reduced seed operation to be performed at a fourth sub-block (e.g., SB3) of the set of sub-blocks to precondition the fourth sub-block for programming. In these embodiments, the reduced seed operation takes a period of time that is shorter than that for preconditioning the first sub-block. The processing logic further causes a program pulse to be sent to the fourth sub-block to program a fourth page of the multiple pages of data to the fourth sub-block. The processing logic further causes a recovery operation to be performed at the fourth sub-block.

At operation 640, the processing logic selectively causes a program verify to be performed on memory cells of the set of sub-blocks after programming the multiple pages of data, e.g., after all of the multiple pages of data are programmed to all of the sub-blocks of the multiple sub-blocks. As discussed previously, selectively causing the program verify to be performed can include performing a single program verify on all of the set of sub-blocks together after each of the set of sub-blocks is in a programmed state.

In other words, in these embodiments, no intervening program verify operation is performed between completing programming of one sub-block and initiating programming of the next sub-block. In another example, no additional program verify operation is performed after initiating programming of the sub-blocks and before the single program verify is performed.

At operation 650, the processing logic causes a check verification operation be performed at the set of sub-blocks to determine results of the program verify (performed at operation 640) and that the pages of data have been completely programmed.

At operation 660, the processing logic ends the program operation to include any final recovery operation of the wordline and/or bitline of the set of sub-blocks. The processing logic further exits the program operation of the set of sub-blocks in response to passing the check verification operation, or causes a scan to be performed of the set of sub-blocks in response to failing the check verification operation.

As illustrated and discussed previously, consolidating the programming within sequential program operations, not repeating operations 610, 620, 640, 650, and 660, and avoiding the additional wordline voltage reset involved with the program verify operation, can all significantly improve the performance of the memory device 130 by eliminating or shortening operations that would otherwise cause performance delays.

Figure 7:
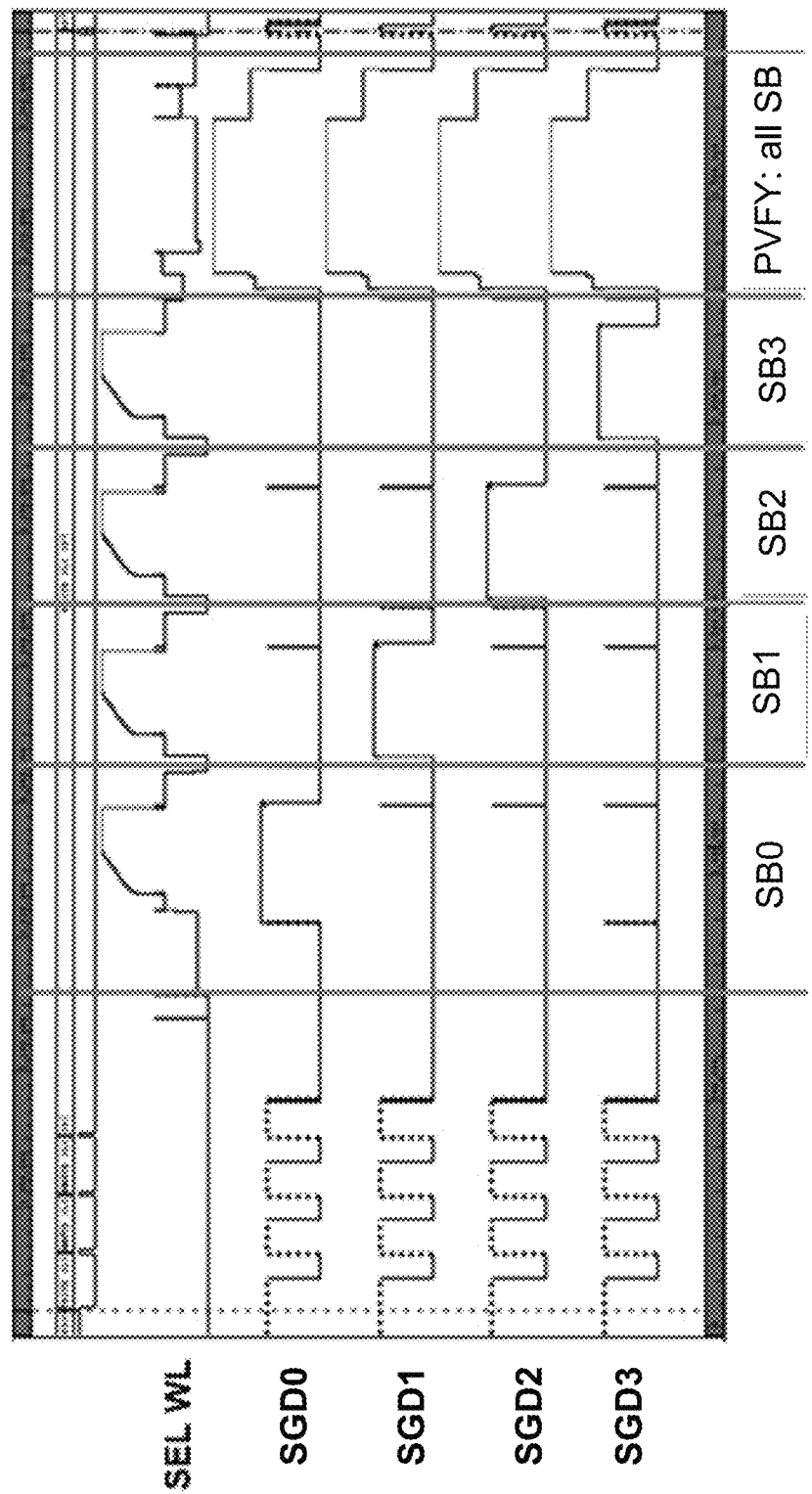
FIG. 7 is a graph of waveforms of drain select lines (SGDs) of the multiple SLC-based sub-blocks and of a selected wordline according to at least one embodiment.

FIG. 7 is a graph of waveforms of drain select lines (SGDs) of the multiple SLC-based sub-blocks and of a selected wordline (SEL WL) according to at least one embodiment, to include corresponding to the embodiments illustrated and discussed with reference to the embodiments of FIGS. 6A-6B. As can be observed, the sequential programming of the four sub-blocks (SB0, SB1, SB2, and SB3) happen in quick succession within minimal recovery and no program verify. The program verify (PVFY) is performed at the very end for all of the four sub-blocks in parallel, e.g., where the selected wordline voltage goes negative and each of the global drain select lines (e.g., SGD0, SGD1, SGD2, SGD3, as illustrated in FIG. 3) for respective sub-blocks are asserted.

Figure 8A:
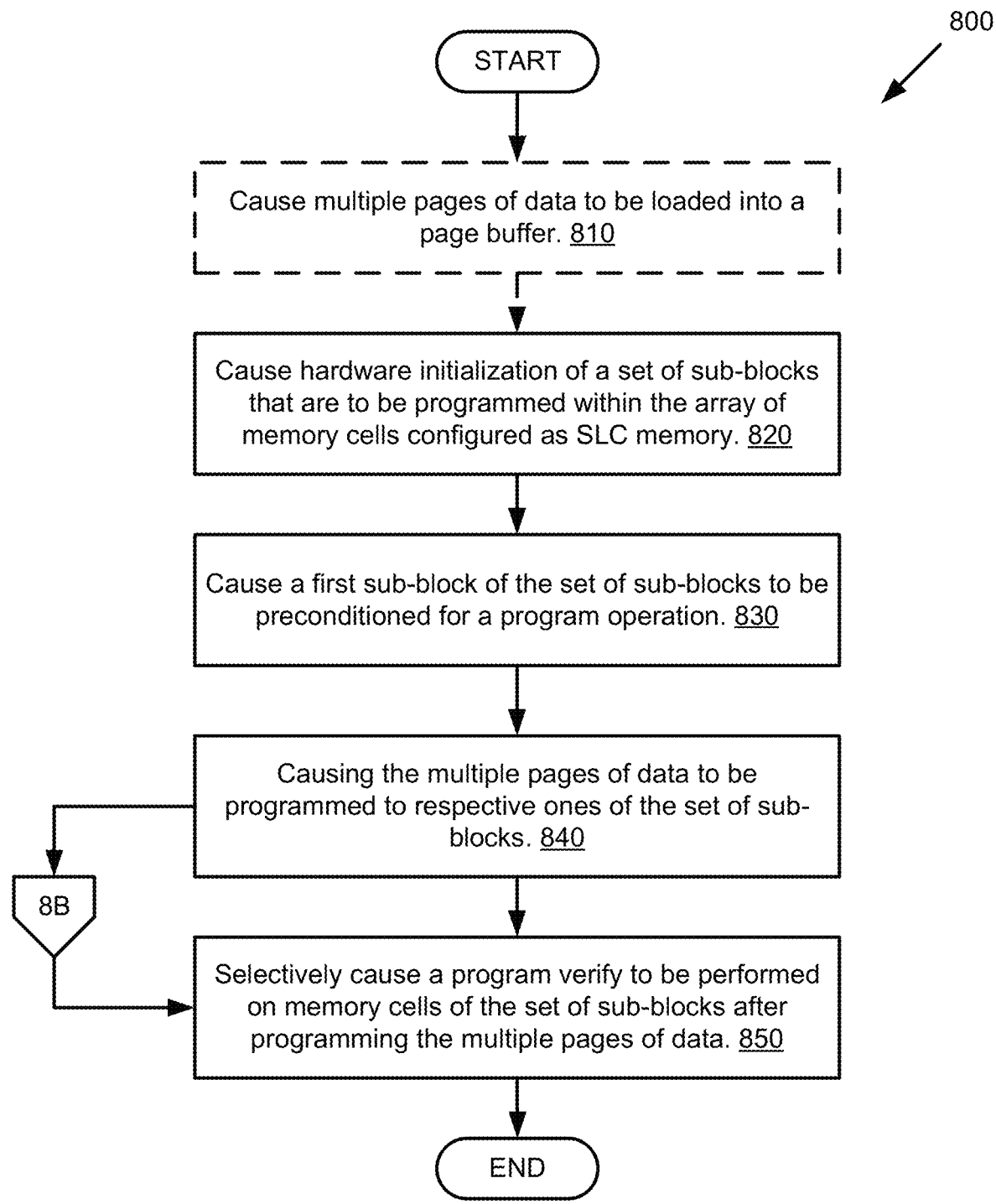
FIGS. 8A-8B are flow diagrams of an example method of shortened programming of memory cells configured as SLC memory in accordance with some embodiments.
Figure 8B:
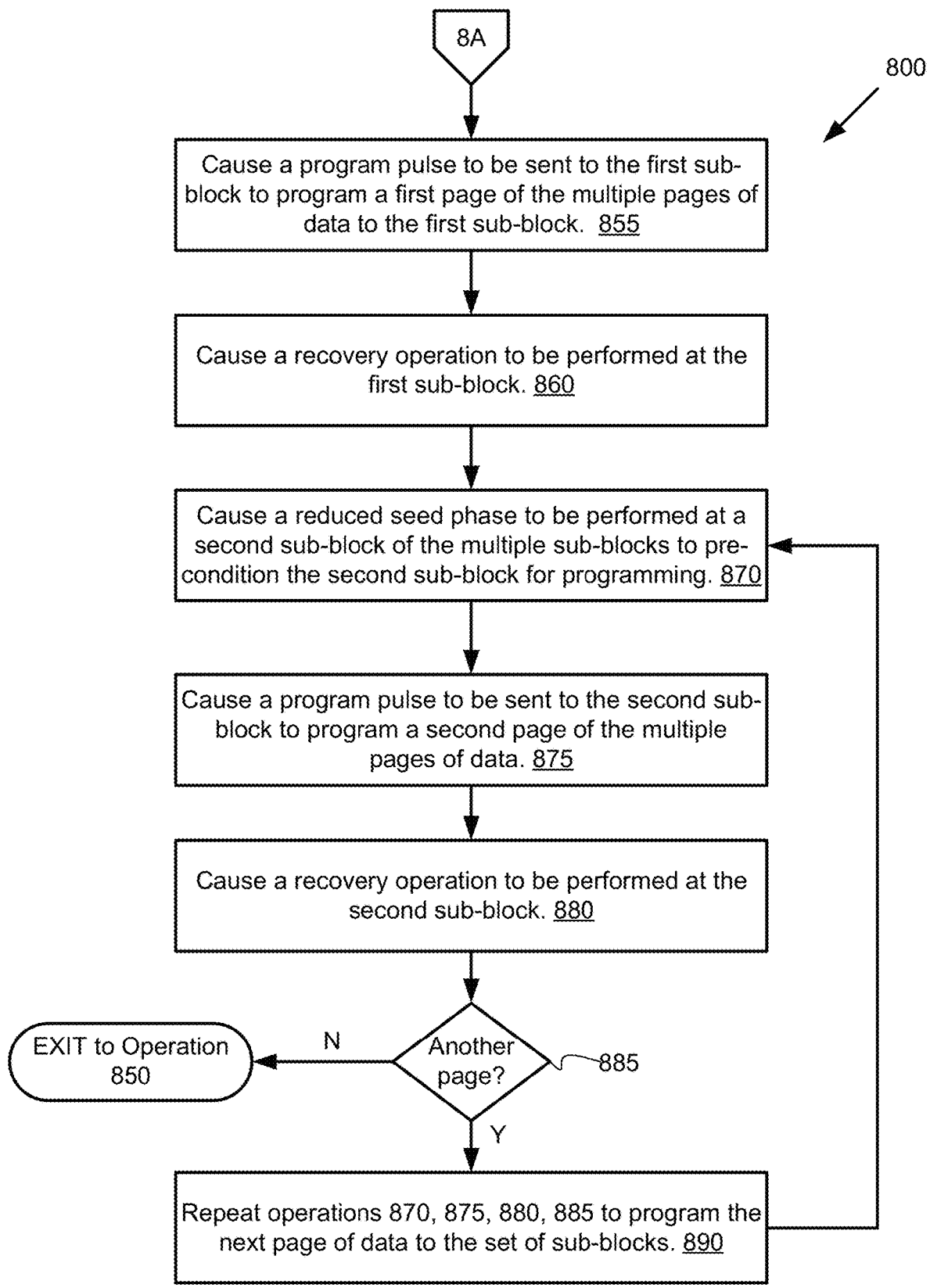

FIGS. 8A-8B are flow diagrams of an example method 800 of shortened programming of memory cells configured as SLC memory in accordance with some embodiments. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the SLC programmer 138 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, pages of data are loaded. More specifically, the processing logic causes multiple pages of data to be loaded into a page buffer of the memory device. This page buffer may be the page buffer 152 discussed with reference to FIGS. 1A-4. Operation 810 is optional (and thus illustrated in dashed lines) because the pages of data could be loaded into other cache or directly streamed from a different source of data in various implementations.

At operation 820, programming hardware is initialized. More specifically, the processing logic causes hardware initialization of a plurality of sub-blocks that are to be programmed within an array of memory cells configured as single-level cell memory. In some embodiments, operation 820 is the "prologue" that was referenced earlier (FIGS. 6A-6B).

At operation 830, a first sub-block is preconditioned. More specifically, the processing logic causes a first sub-block of the set of sub-blocks to be preconditioned for a program operation. This can be understood as seeding or preconditioning voltage levels of memory cells of the sub-block for programming, e.g., to include of a wordline and/or a bitline.

At operation 840, multiple pages of data are programmed. More specifically, the processing logic causes the multiple pages of data to be programmed to respective ones of the set of sub-blocks. The operations of FIG. 8B can be repeatedly performed in order to sequentially program each sub-block of the set of sub-blocks before the program verify is performed.

At operation 850, a program verify is performed on all of the sub-blocks. More specifically, the processing logic selectively causes a program verify to be performed on memory cells of the set of sub-blocks after programming the multiple pages of data to the set of sub-blocks. In some embodiments, selectively causing the program verify to be performed includes performing a program verify on all of the set of sub-blocks together after each of the set of sub-blocks is in a programmed state.

Operations 855 through 890 of the method 800 illustrated in FIG. 8B can be performed in order to program the multiple pages to respective sub-blocks of the set of sub-blocks, and thus is an expansion on operation 840. At operation 855, the first sub-block is programmed. More specifically, the processing logic causes a program pulse to be sent to the first sub-block to program a first page of the multiple pages of data to the first sub-block.

At operation 860, the first sub-block recovers. More specifically, the processing logic causes a recovery operation to be performed at the first sub-block, e.g., to discharge the wordline.

At operation 870, a reduced seed operation is performed. More specifically, the processing logic causes a reduced seed operation to be performed at a second sub-block of the set of sub-blocks to precondition the second sub-block for programming. In some embodiments, the reduced seed operation takes a period of time that is shorter than that for preconditioning the first sub-block.

At operation 875, a program pulse is sent. More specifically, the processing logic causes a program pulse to be sent to the second sub-block to program a second page of the set of pages of data to the second sub-block.

At operation 880, the second sub-block recovers. More specifically, the processing logic causes a recovery operation to be performed at the second sub-block, e.g., to discharge the wordline.

At operation 885, is there another page is programmed. More specifically, the processing logic determines whether there is a subsequent page of data (e.g., a third page, fourth page, and so forth) to additionally program. If there is another page, at operation 890, the processing logic repeats operations 870, 875, 880, and 885 to program the next page of data to the set of sub-blocks, e.g., to program a remainder of the multiple pages of data to the set of sub-blocks. Otherwise, if, at operation 885, there are no more pages to be programmed related to the program operation of the multiple pages of data, the method 800 exits back to operation 850 in FIG. 8A to complete the program verify.

Although not specifically illustrated or discussed with reference to FIGS. 8A-8B, operations 650 and 660 discussed with reference to FIG. 6B can still be performed as well. Further, other operations discussed herein but not specifically discussed with reference to FIGS. 8A-8B can still be performed so long as the program verify is performed after every sub-block of the set of sub-blocks is programmed with a page of data as per operations 840 and 850. Further the embodiments illustrated and described throughout the various Figures herein are compatible with cache programming and thus can still leverage the efficiencies of cache programming.

Figure 9:
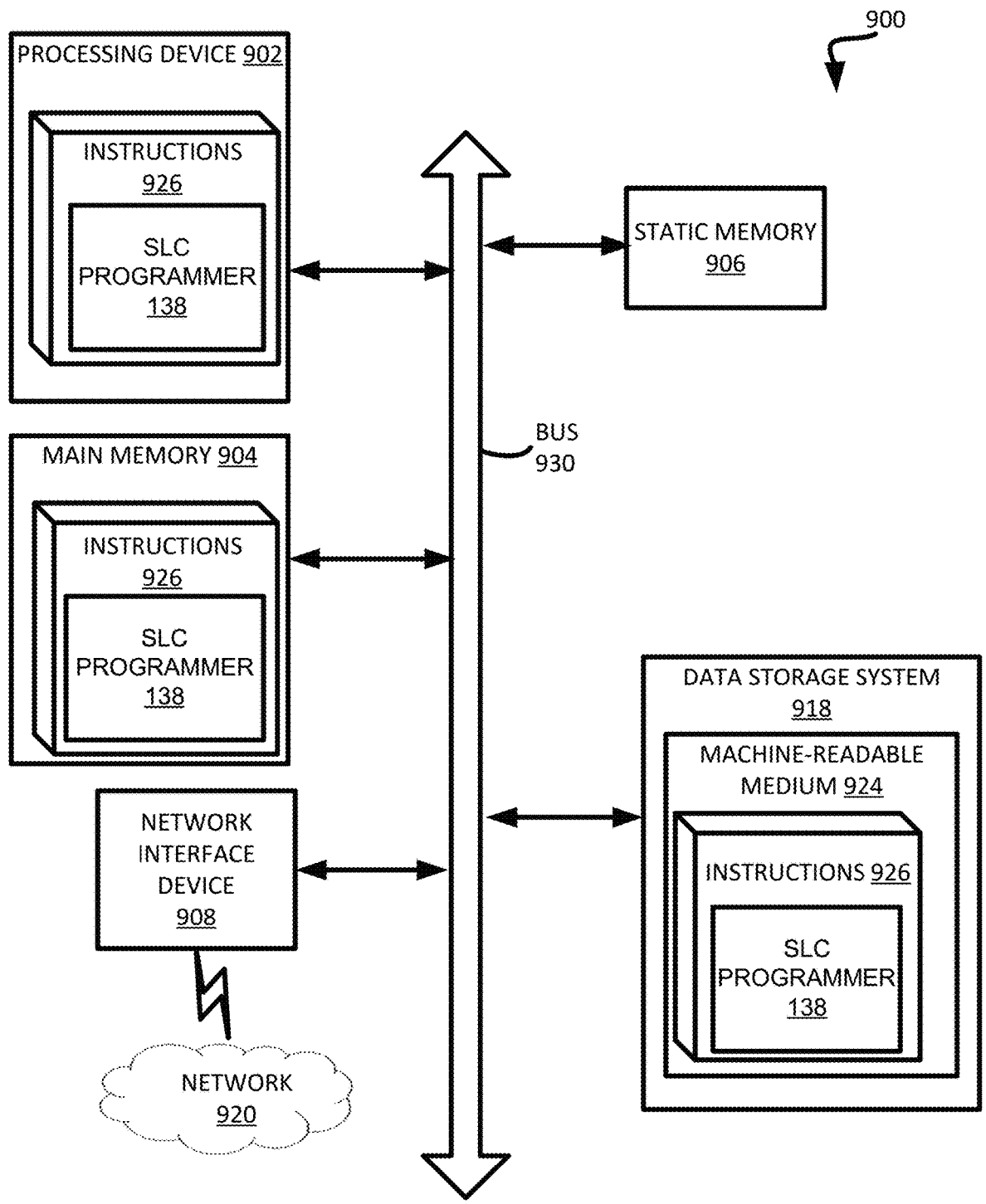
FIG. 9 is a block diagram of an example computer system in which embodiments of the present disclosure can operate.

FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to cache manager 111 and/or SLC programmer 138 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a data storage system 918, which communicate with each other via a bus 930.

Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920.

The data storage system 918 can include a machine-readable storage medium 924 (also known as a computer-readable medium, such as a non-transitory computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1A.

In one embodiment, the instructions 926 include instructions to implement functionality corresponding to cache manager 111 and/or SLC programmer 138 of FIG. 1A). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium (e.g., non-transitory computer-readable storage medium), such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
    an array of memory cells configured as single-level cell memory; and
    control logic operatively coupled to the array of memory cells, the control logic to perform operations comprising:
        causing hardware initialization of a plurality of sub-blocks that are to be programmed within the array of memory cells;
        causing a first sub-block of the plurality of sub-blocks to be preconditioned for a program operation;
        causing a plurality of pages of data to be programmed to respective ones of the plurality of sub-blocks, comprising:
            (i) causing a program pulse to be sent to the first sub-block to program a first page of the plurality of pages of data to the first sub-block;
            (ii) causing a recovery operation to be performed at the first sub-block; and
            (iii) causing a reduced seed operation to be performed at a second sub-block of the plurality of sub-blocks to precondition the second sub-block for programming; and
        selectively causing a program verify to be performed on memory cells of the plurality of sub-blocks after programming the plurality of pages of data.

2. The memory device of claim 1, wherein selectively causing the program verify to be performed comprises performing a single program verify on all of the plurality of sub-blocks together after each of the plurality of sub-blocks is in a programmed state.

3. The memory device of claim 1, wherein the operations further comprise causing the plurality of pages of data to be loaded into a page buffer before performing the hardware initialization.

4. The memory device of claim 1, wherein the reduced seed operation takes a period of time that is shorter than that for preconditioning the first sub-block.

5. The memory device of claim 1, wherein causing the plurality of pages of data to be programmed further comprises:
    (iv) causing a program pulse to be sent to the second sub-block to program a second page of the plurality of pages of data to the second sub-block;
    (v) causing a recovery operation to be performed at the second sub-block; and
    repeating (iii) through (v) to program a remainder of the plurality of pages of data to the plurality of sub-blocks.

6. The memory device of claim 1, wherein the operations further comprise:
    causing a check verification operation be performed at the plurality of sub-blocks to determine results of the program verify and that the pages of data have been completely programmed;
    exiting a program operation of the plurality of sub-blocks in response to passing the check verification operation; and
    causing a scan to be performed of the plurality of sub-blocks in response to failing the check verification operation.

7. A method comprising:
    causing, by control logic of a memory device, hardware initialization of a plurality of sub-blocks that are to be programmed within an array of memory cells configured as single-level cell memory;
    causing, by the control logic, a first sub-block of the plurality of sub-blocks to be preconditioned for a program operation;
    causing, by the control logic, a plurality of pages of data to be programmed to respective ones of the plurality of sub-blocks, comprising:
        (i) causing a program pulse to be sent to the first sub-block to program a first page of the plurality of pages of data to the first sub-block;
        (ii) causing a recovery operation to be performed at the first sub-block; and
        (iii) causing a reduced seed operation to be performed at a second sub-block of the plurality of sub-blocks to precondition the second sub-block for programming; and
    selectively causing, by the control logic, a program verify to be performed on memory cells of the plurality of sub-blocks after programming the plurality of pages of data.

8. The method of claim 7, wherein selectively causing the program verify to be performed comprises performing a single program verify on all of the plurality of sub-blocks together after each of the plurality of sub-blocks is in a programmed state.

9. The method of claim 7, further comprising causing the plurality of pages of data to be loaded into a page buffer before performing the hardware initialization.

10. The method of claim 7, wherein the reduced seed operation takes a period of time that is shorter than that for preconditioning the first sub-block.

11. The method of claim 7, wherein causing the plurality of pages of data to be programmed further comprises:
    (iv) causing a program pulse to be sent to the second sub-block to program a second page of the plurality of pages of data to the second sub-block;
    (v) causing a recovery operation to be performed at the second sub-block; and
    repeating (iii) through (v) to program a remainder of the plurality of pages of data to the plurality of sub-blocks.

12. The method of claim 7, further comprising:
    causing a check verification operation be performed at the plurality of sub-blocks to determine results of the program verify and that the pages of data have been completely programmed;

exiting a program operation of the plurality of sub-blocks in response to passing the check verification operation; and causing a scan to be performed of the plurality of sub-blocks in response to failing the check verification operation.

13. An integrated circuit comprising:
at least one die comprising an array of memory cells configured as single-level cell memory; and
control logic operatively coupled to the at least one die, the control logic to perform operations comprising:
   causing a plurality of pages of data to be loaded into a page buffer that is coupled with the array of memory cells;
   causing hardware initialization of a plurality of sub-blocks that are to be programmed within the array of memory cells;
   causing a first sub-block of the plurality of sub-blocks to be preconditioned for a program operation;
   causing the plurality of pages of data to be programmed to respective ones of the plurality of sub-blocks, comprising:
      (i) causing a program pulse to be sent to the first sub-block to program a first page of the plurality of pages of data to the first sub-block;
      (ii) causing a recovery operation to be performed at the first sub-block; and
      (iii) causing a reduced seed operation to be performed at a second sub-block of the plurality of sub-blocks to precondition the second sub-block for programming; and
   selectively causing a program verify to be performed on memory cells of the plurality of sub-blocks after programming the plurality of pages of data.

14. The integrated circuit of claim 13, wherein selectively causing the program verify to be performed comprises performing a single program verify on all of the plurality of sub-blocks together after each of the plurality of sub-blocks is in a programmed state.

15. The integrated circuit of claim 13, wherein the reduced seed operation takes a period of time that is shorter than that for preconditioning the first sub-block.

16. The integrated circuit of claim 13, wherein causing the plurality of pages of data to be programmed further comprises:
   (iv) causing a program pulse to be sent to the second sub-block to program a second page of the plurality of pages of data to the second sub-block;
   (v) causing a recovery operation to be performed at the second sub-block; and
   repeating (iii) through (v) to program a remainder of the plurality of pages of data to the plurality of sub-blocks.

17. The integrated circuit of claim 13, wherein the operations further comprise:
   causing a check verification operation be performed at the plurality of sub-blocks to determine results of the program verify and that the pages of data have been completely programmed;
   exiting a program operation of the plurality of sub-blocks in response to passing the check verification operation; and
   causing a scan to be performed of the plurality of sub-blocks in response to failing the check verification operation.

\* \* \* \* \*